(12) United States Patent
Jang et al.

(10) Patent No.: US 11,289,903 B2
(45) Date of Patent: Mar. 29, 2022

(54) SUPPRESSING OVERVOLTAGE TRANSIENTS IN A SERIAL INTERFACE

(71) Applicant: TEXAS INSTRUMENTS INCORPORATED, Dallas, TX (US)

(72) Inventors: Byungchul Jang, Allen, TX (US); Roland Son, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 114 days.

(21) Appl. No.: 16/152,268

(22) Filed: Oct. 4, 2018

(65) Prior Publication Data
US 2020/0112167 A1    Apr. 9, 2020

(51) Int. Cl.
| H02H 9/04 | (2006.01) |
| H02H 1/00 | (2006.01) |
| G06F 13/42 | (2006.01) |
| G06F 13/20 | (2006.01) |
| H03K 5/24 | (2006.01) |

(52) U.S. Cl.
CPC ............ H02H 9/04 (2013.01); G06F 13/20 (2013.01); G06F 13/4282 (2013.01); H02H 1/0007 (2013.01); H03K 5/24 (2013.01); *G06F 2213/0042* (2013.01)

(58) Field of Classification Search
CPC ........ H02H 3/202; H02H 9/40; H02H 1/0007; H02H 7/20; H02H 3/20; H02H 3/26; H02H 3/28; H02H 3/325; H02H 9/046; H02H 9/00; H02H 7/1252; G06F 2213/0042; G06F 2213/40; G06F 13/20; G06F 13/4248; H01C 7/13
See application file for complete search history.

(56) References Cited

U.S. PATENT DOCUMENTS

| 7,031,129 | B2 * | 4/2006 | Mayama | H03K 17/08122 |
| | | | | 361/91.1 |
| 8,009,395 | B2 * | 8/2011 | Graves | H02H 3/20 |
| | | | | 361/111 |
| 8,537,517 | B1 * | 9/2013 | Banak | H02H 11/002 |
| | | | | 361/93.1 |
| 8,847,565 | B2 * | 9/2014 | Vemula | G05F 1/613 |
| | | | | 323/271 |
| 8,890,599 | B1 * | 11/2014 | Xiao | H03K 5/08 |
| | | | | 327/321 |
| 9,312,688 | B1 * | 4/2016 | Farina | H02M 3/07 |
| 10,110,216 | B1 * | 10/2018 | Knoedgen | H03K 17/0826 |
| 2005/0001594 | A1 * | 1/2005 | Felder | H02J 7/00308 |
| | | | | 320/134 |
| 2008/0088277 | A1 * | 4/2008 | Wang | H02J 7/0016 |
| | | | | 320/119 |
| 2008/0165460 | A1 * | 7/2008 | Whitby-Strevens | ........... |
| | | | | G06F 13/4072 |
| | | | | 361/86 |

(Continued)

*Primary Examiner* — Gustavo A Rosario-Benitez
(74) *Attorney, Agent, or Firm* — Ray A. King; Charles A. Brill; Frank D. Cimino

(57) ABSTRACT

An apparatus includes a transistor coupled between an input pin and an output pin and an overvoltage detection circuit configured to receive a serial interface signal from the input pin and generate an enable signal in response to a voltage of the serial interface signal exceeding a voltage threshold. The apparatus also includes a first circuit configured to apply a clamping voltage to a gate of the transistor based on the enable signal to regulate a voltage provided at the output pin.

24 Claims, 7 Drawing Sheets

(56) References Cited

U.S. PATENT DOCUMENTS

| | | | | |
|---|---|---|---|---|
| 2009/0085535 A1* | 4/2009 | Wei | ............... | H02M 3/156 |
| | | | | 323/272 |
| 2012/0112686 A1* | 5/2012 | Zhang | ............... | H02J 7/0021 |
| | | | | 320/107 |
| 2012/0126625 A1* | 5/2012 | Maher | ............... | G06F 1/30 |
| | | | | 307/80 |
| 2013/0031398 A1* | 1/2013 | Srivastava | ............... | G06F 1/26 |
| | | | | 713/340 |
| 2016/0156343 A1* | 6/2016 | Chen | ............... | H02H 3/20 |
| | | | | 361/86 |
| 2016/0173084 A1* | 6/2016 | Huang | ............... | H03K 17/687 |
| | | | | 361/91.5 |
| 2016/0190794 A1* | 6/2016 | Forghani-Zadeh | ............... | H02H 9/048 |
| | | | | 361/86 |
| 2017/0047731 A1* | 2/2017 | Manohar | ............... | H03K 5/08 |
| 2017/0346273 A1* | 11/2017 | Cheng | ............... | H02H 3/20 |
| 2017/0366002 A1* | 12/2017 | Zhao | ............... | H02H 9/046 |
| 2018/0129256 A1* | 5/2018 | Hafizi | ............... | H03K 19/00315 |
| 2019/0140473 A1* | 5/2019 | Peeters | ............... | H02J 7/00047 |
| 2019/0214980 A1* | 7/2019 | Kim | ............... | H03K 17/08142 |
| 2019/0267792 A1* | 8/2019 | Li | ............... | H02H 3/202 |
| 2021/0044101 A1* | 2/2021 | Mukhopadhyay | ............... | G06F 13/4295 |

* cited by examiner

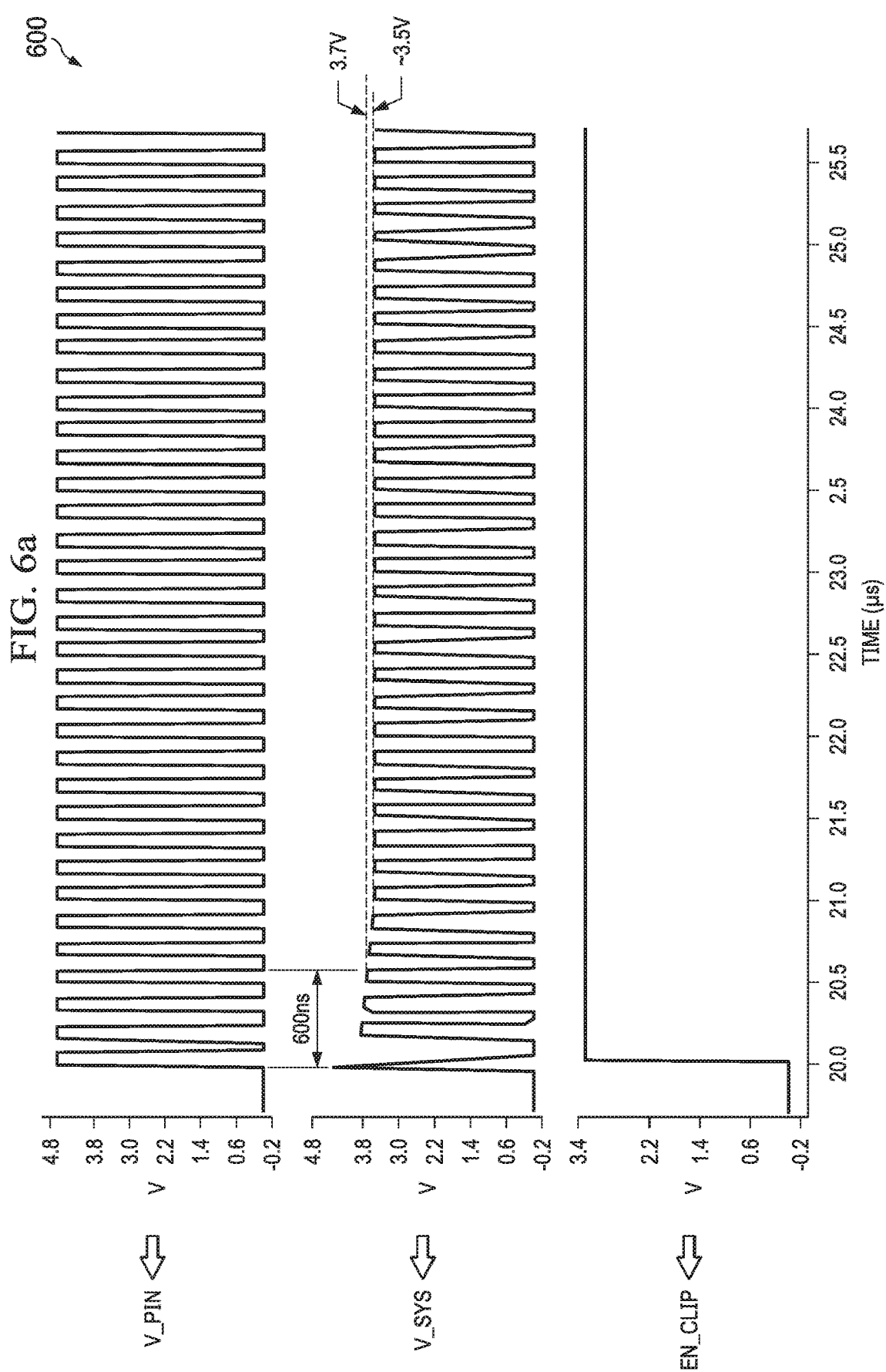

SUPPRESSING OVERVOLTAGE TRANSIENTS IN A SERIAL INTERFACE

SUMMARY

In accordance with at least one example of the disclosure, an apparatus includes a transistor coupled between an input pin and an output pin and an overvoltage detection circuit configured to receive a serial interface signal from the input pin and generate an enable signal in response to a voltage of the serial interface signal exceeding a voltage threshold. The apparatus also includes a first circuit configured to apply a clamping voltage to a gate of the transistor based on the enable signal to regulate a voltage provided at the output pin.

In accordance with at least one other example of the disclosure, an apparatus includes a first transistor comprising a first terminal coupled to an input pin and a second terminal coupled to an output pin and an overvoltage detection circuit coupled to the input pin. The overvoltage detection circuit includes a first comparator comprising a non-inverting input terminal coupled to the input pin and an inverting input terminal coupled to a supply voltage source, a pulse extender coupled to an output of the first comparator, and an OR gate comprising inputs coupled to the output of the first comparator and to an output of the pulse extender. The apparatus also includes a first circuit comprising a second transistor having a third terminal coupled to the supply voltage source, a fourth terminal coupled to a current source, and a fifth terminal coupled to the fourth terminal of the second transistor; and a switch configured to couple a sixth terminal of the first transistor to the first circuit, wherein the switch is coupled to an output of the OR gate.

In accordance with at least one further example of the disclosure, a system includes a receiver having a Universal Serial Bus (USB) port configured to couple to a transmitter by way of a USB interconnect, a transistor coupled to the USB port and to an output pin, and an overvoltage detection circuit configured to receive a USB interface signal from the USB port and generate an enable signal in response to a voltage of the USB interface signal exceeding a voltage threshold. The receiver also includes a first circuit configured to apply a clamping voltage to a gate of the transistor based on the enable signal to regulate a voltage provided at the output pin.

BRIEF DESCRIPTION OF THE DRAWINGS

For a detailed description of various examples, reference will now be made to the accompanying drawings in which:

FIGS. 6a and 6b show waveforms demonstrating the suppression of overvoltage transients in conjunction with an associated enable control signal in accordance with various examples.

DETAILED DESCRIPTION

Figure 1A:
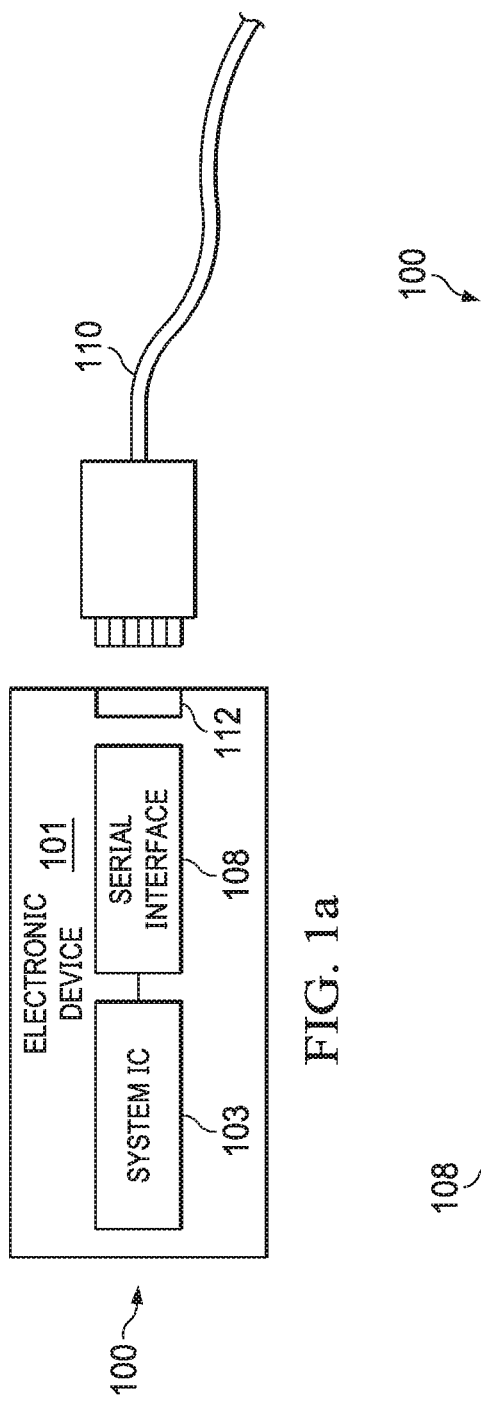
FIG. 1a shows a block diagram of a system including a serial interface integrated circuit in accordance with various examples.

In communications over a serial interface, such as a Universal Serial Bus (USB) interface, impedance mismatches may occur between the source (or transmitter), the serial cable itself, and intervening board routing characteristic impedances. These impedance mismatches cause reflections that can constructively interfere with the signaling voltage to create positive and negative voltage transients at the receiver. The resultant overvoltage stress damages low-voltage circuit components in an electronic device containing the receiver, leading to potential failures in the field.

Examples of the present disclosure include a receiver of a serial interface signal, such as a USB signal. In some examples, the receiver is implemented in an application-specific integrated circuit (ASIC), such as a USB controller, in an electronic device. In other examples, the receiver is distributed across multiple integrated circuits (ICs) housed in a single package that is implemented in an electronic device. In still other examples, the receiver is embedded in a system on chip (SoC) of an electronic device. The particular type of electronic device within which the receiver is embedded may vary and can include personal computers, tablets, cameras, smartphones, and other electronic products. The receiver includes an overvoltage detection circuit coupled to an input pin of the receiver, such as a USB port. The overvoltage detection circuit compares a voltage of the signal received at the input pin to a threshold voltage, which in some implementations is a supply voltage of the receiver. For example, in the example of a USB interface, the expected voltage of a received signal is between approximately 0 and 3.3 volts (V), and thus the threshold voltage may be approximately 3.3V. In other examples, an additional voltage offset may be added, such that the comparison is not to the supply voltage (e.g., approximately 3.3V) precisely, but rather to a threshold voltage that is the supply voltage plus a voltage offset.

In the event that an overvoltage transient is detected, the overvoltage detection circuit generates an enable signal. In some situations, the overvoltage transient is very short in duration, which may be on the order of a few nanoseconds in the example of a USB interface. To address the short transient duration, the overvoltage detection circuit is configured to extend the duration of the enable signal such that the enable signal is activated for a period that is longer than just a single overvoltage transient period. In some implementations, the enable signal may be asserted through the entire receiving window of the receiver to clamp an output pin of the receiver, as described further below.

Where the receiver is part of a USB controller IC in an end system, such as a laptop computer, the output pin of the receiver may be coupled to a system IC of the laptop that processes the received serial interface signal. Similarly, where the receiver is distributed across multiple ICs in a single package, the output pin may be coupled to a system IC of the laptop that processes the received serial interface signal. Where the receiver is part of a SoC in an end system, the output pin may be substituted by a non-pin electrical connection and may be coupled to another portion of the SoC that processes the received serial interface signal. (For clarity and brevity, the remainder of this description uses the term output pin, which encompasses non-pin output connections.)

A switch, which in some examples is an n-type metal-oxide-semiconductor field effect transistor (MOSFET), is coupled to the input pin and the output pin. The switch acts as a source follower that, when provided with an appropriate gate voltage, serves to clamp the output pin such that the voltage of the serial interface signal provided to the output pin (an output signal) is held to a tolerable level. When the overvoltage detection circuit asserts an enable signal, an alternating current (AC) clipper circuit is coupled to the gate of the switch and applies a voltage to the gate of the switch to clamp a voltage of the output signal to a particular value. The voltage applied by the AC clipper circuit may be slightly higher than the supply voltage to maintain integrity of the output signal. As a result, the circuitry coupled to the output pin (e.g., a system IC of a laptop) avoids exposure to overvoltage transients, which are effectively clamped and suppressed by the switch, reducing the likelihood of failures in the field.

FIG. 1a shows a system 100 in accordance with an example of the disclosure. The system 100 includes an electronic device 101, which may be a smartphone, a personal computer, a tablet device, a camera, or another electronic device that receives a serial interface signal. The electronic device 101 includes a system IC 103, which generally carries out and provides the functional aspects of the electronic device 101. The electronic device 101 also includes a serial interface IC 108 (e.g., a USB controller) that is coupled to the system IC 103. In other examples, the system IC 103 and the serial interface IC 108 may be integrated as part of a SoC. In yet other examples and as described above, multiple serial interface ICs 108 are used and are housed together within a single package. The serial interface IC 108 transmits and receives serial interface signals through a serial port 112. A serial cable or interconnect 110 couples the serial port 112 of the electronic device 101 to another device.

Figure 1B:
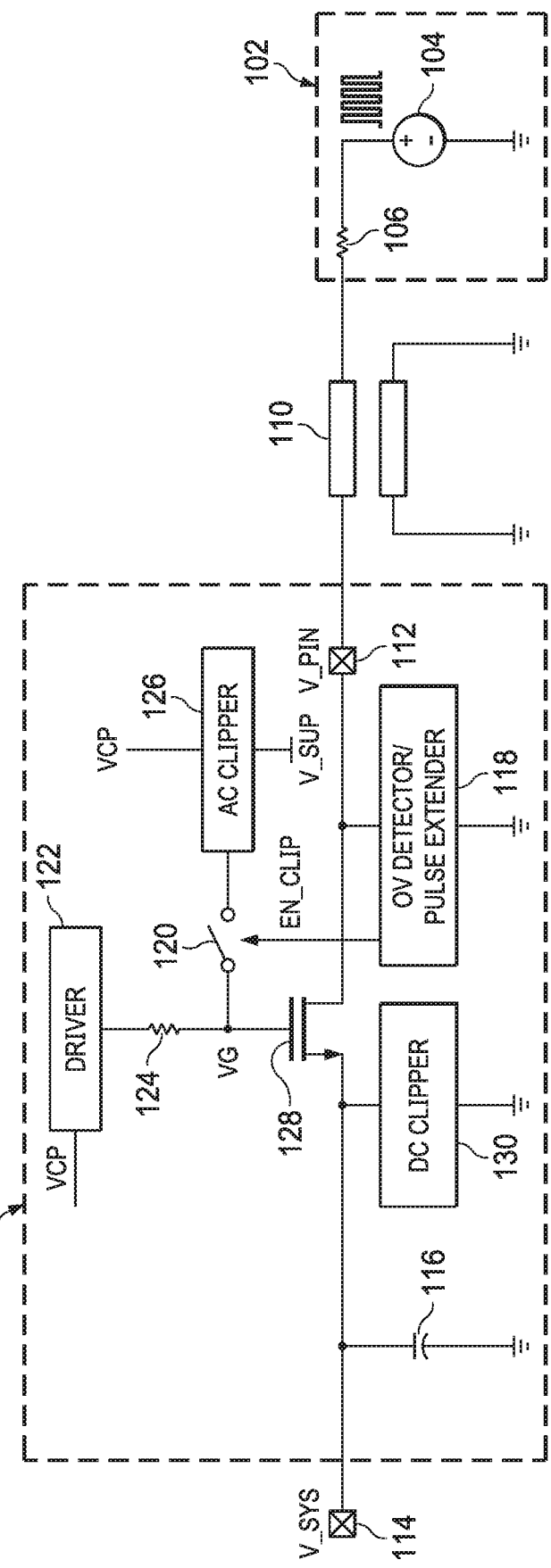
FIG. 1b shows a circuit diagram of a system for detecting and suppressing overvoltage transients in accordance with various examples.

FIG. 1b shows an example of the serial interface IC 108 in further detail. In particular, in the example of FIG. 1b, the serial interface IC 108 is referred to as a receiver 108 and is described with respect to its functionality as a receiver 108 when receiving a serial interface signal. A serial interface transmitter 102 (e.g., another serial interface IC on another electronic device) comprises a voltage source 104 that generates a serial interface signal (e.g., a USB signal) and a resistor 106. The serial interface receiver 108 is coupled to the serial interface transmitter 102 by way of a serial cable or interconnect represented by transmission line 110.

The serial interface receiver 108 includes an input pin 112, which in some implementations may encompass a USB port. The input pin 112 is selectively coupled to an output pin 114 by a switch 128. In certain examples, the switch 128 is a transistor, such as an n-type MOSFET 128, although other types of switches (e.g., p-type MOSFETs, bipolar junction transistors (BJTs)) are contemplated. The remainder of this discussion assumes the use of an n-type MOSFET. In the particular example of FIG. 1b, the input pin 112 is coupled to a drain of the n-type MOSFET 128, while the output pin 114 is coupled to a source of the n-type MOSFET 128. Voltages at the input pin 112 and the output pin 114 are notated as V_PIN and V_SYS, respectively. V_SYS represents the voltage supplied to the circuitry external to the receiver 108, such as the system IC 103 in FIG. 1a.

An overvoltage detection circuit 118 is coupled to the input pin 112 and generates an enable signal that operates a switch 120, which is, in an example, a MOSFET. When the switch 120 is open, a gate of the n-type MOSFET 128 is driven by a gate driver 122 coupled to a charge pump (not shown for simplicity, but which supplies a voltage VCP to the gate driver 122) such that the n-type MOSFET 128 operates in a low impedance state. A resistor 124 may be employed to produce a gate voltage, notated as VG, that is of an appropriate value. When the switch 120 is closed, an AC clipper circuit 126 is coupled to the gate of the n-type MOSFET 128 and modifies the gate voltage VG produced by the driver 122 and the resistor 124. The AC clipper circuit 126 is shown as coupled to a supply voltage source, notated as V_SUP, which in some implementations (e.g., a USB interface) is approximately 3.3V. In some examples, a direct current (DC) clipper 130 is coupled to the output pin 114.

As explained, an impedance mismatch may occur between the transmitter 102 and its circuitry and the transmission line 110. These impedance mismatches result in positive and negative voltage transients at the receiver 108, which damage low-voltage circuit components in circuitry downstream from the receiver 108, such as the system IC 103 in FIG. 1. The overvoltage detection circuit 118 receives the serial interface signal, such as a USB signal, from the input pin 112 and determines whether a voltage of the serial interface signal exceeds a threshold. Stated another way, the overvoltage detection circuit 118 identifies overvoltage transients in the received serial interface signal. When the overvoltage detection circuit 118 identifies an overvoltage transient, the overvoltage detection circuit 118 generates an enable signal EN_CLIP. As will be explained further below, in some implementations the enable signal is asserted for a period that is longer than the duration of the overvoltage transient.

The enable signal closes the switch 120, coupling the AC clipper circuit 126 to the gate of the n-type MOSFET 128. The AC clipper circuit 126 is configured to apply a clamping voltage to the gate of the n-type MOSFET 128 in order to clamp or regulate a voltage of the output signal provided to the output pin 114. In this implementation, the n-type MOSFET 128 acts as a source-follower, clamping the input signal provided by the input pin 112 by at least a threshold voltage of the n-type MOSFET 128 lower than VG, resulting in an output signal with a voltage that is clamped relative to the clamping voltage provided by the AC clipper circuit 126. When the enable signal is not generated or is de-asserted, the switch 120 is open and VG is held at a higher level than the clamping voltage by the gate driver 122 such that the n-type MOSFET 128 operates in a suitably low resistance state.

In some examples, the DC clipper circuit 130 is coupled to the output pin 114 to regulate V_SYS. For example, if the transmitter 102 is a PS/2 peripheral such as a mouse plugged into a USB port 112 via an adapter (not shown), the USB D+ and D− lines are pulled to a 5V supply. Typically, shorting of the USB D+ and D− pins to the 5V USB VBUS supply results in a fault condition, and could damage low-voltage circuitry in the electronic device 101. The DC clipper circuit 130 compares V_SYS to a threshold DC voltage and, as a result of V_SYS exceeding the threshold DC voltage, conducts current from the output pin 114 in such a DC overvoltage condition to regulate V_SYS, thereby protecting the low-voltage circuitry of the electronic device 101.

Figure 2:
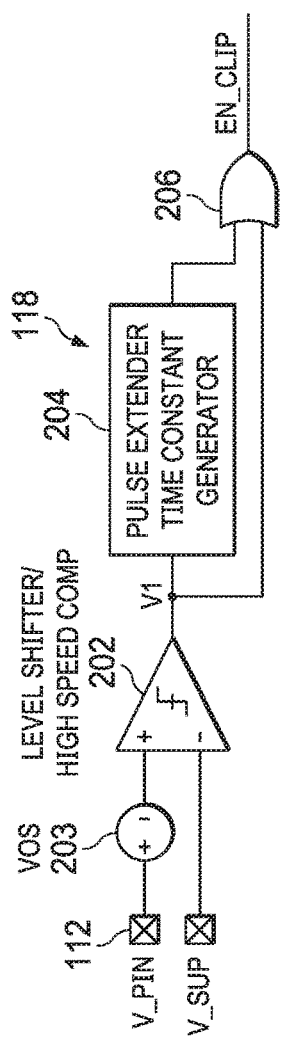
FIG. 2 shows a circuit diagram of an overvoltage detection circuit in accordance with various examples.

FIG. 2 shows the overvoltage detection circuit 118 in further detail. The overvoltage detection circuit 118 includes a comparator 202 that is coupled to the input pin 112 and the supply voltage source V_SUP. In some implementations, an additional voltage offset 203 is subtracted from V_PIN (or equivalently added to V_SUP) to provide flexibility in determining whether an overvoltage transient exists in signals received at the input pin 112. The comparator 202 generates a high output when V_PIN (less a voltage offset, in some implementations) is greater than V_SUP and generates a low output when V_PIN (less a voltage offset, in some implementations) is less than V_SUP. The output of the comparator 202 is fed to a pulse extender 204, which extends a high output from the comparator 202 for a certain amount of time, for example for a period longer than the duration of a single overvoltage transient, which in the example of USB may be on the order of a few nanoseconds.

An OR gate 206 receives the output of the pulse extender 204 and the output of the comparator 202, and generates the enable signal EN_CLIP to control the switch 120. The OR gate 206 serves to mitigate the effects of propagation delay of the pulse extender 204 by passing the output of the comparator 202 through as the enable signal and then, after a propagation delay, generating an output based on both the output of the comparator 202 and the output of the pulse extender 204. In this way, an enable signal is asserted both rapidly and for an extended duration, for example to cover the entire receiving window of the receiver 108.

Figure 3:
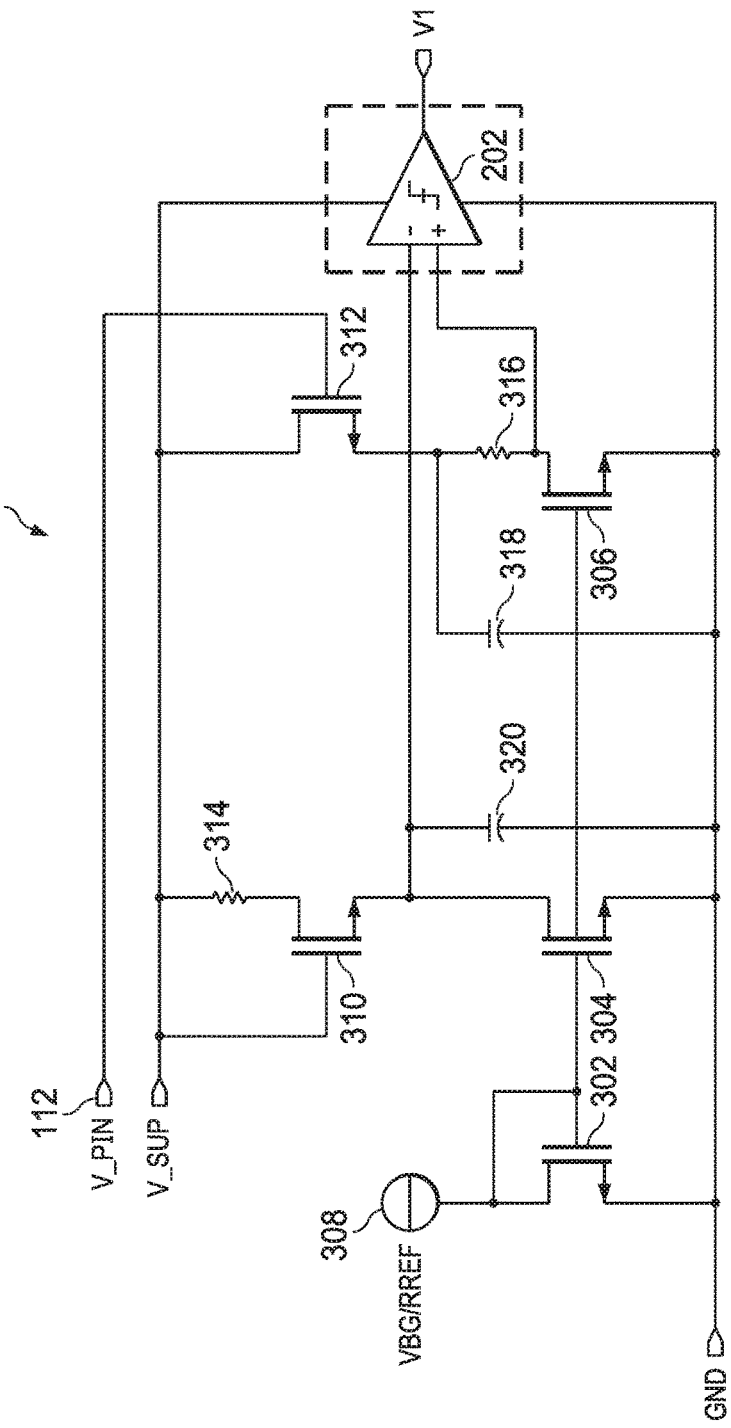
FIG. 3 shows a circuit diagram of a portion of the overvoltage detection circuit in further detail and in accordance with various examples.

FIG. 3 shows an example of the voltage offset circuit 203, described above with respect to FIG. 2, which is a part of the overvoltage detection circuit 118. In FIG. 2, the voltage offset circuit 203 is shown conceptually as subtracting from V_PIN, while V_SUP is shown conceptually as being directly input to the comparator 202. Although the particular implementation shown in FIG. 3 does not provide V_SUP as a direct input to the comparator 202, the effect is essentially the same as in FIG. 2 and as explained below.

In this example, the voltage offset circuit 203 subtracts from V_PIN rather than adding to V_SUP. However, as explained above, adding to V_SUP is equivalently within the scope of the present disclosure. The voltage offset circuit 203 includes a current mirror comprising n-type MOSFETs 302, 304, 306, each having its source coupled to ground. The n-type MOSFET 302 operates in saturation mode due to its drain-to-gate coupling. A current source 308 generates a current through the n-type MOSFET 302, which is generated for example by applying a bandgap reference voltage (Vbg) across a resistor of a particular value ($R_{REF}$). This current is mirrored through the n-type MOSFETs 304 and 306.

The voltage offset circuit 203 includes n-type MOSFET 310, having its gate coupled to V_SUP, its drain coupled to V_SUP by way of a resistor 314, and its source coupled to the drain of n-type MOSFET 304 and to an inverting terminal of the comparator 202. A capacitor 320 also couples the source of n-type MOSFET 310 to ground to smooth the signal provided to the comparator 202 input. The voltage offset circuit 203 also includes n-type MOSFET 312, having its gate coupled to V_PIN, its drain coupled to V_SUP, and its source coupled by way of resistor 316 to the drain of n-type MOSFET 306 and to a non-inverting terminal of the comparator 202. A capacitor 318 also couples the source of n-type MOSFET 312 to ground to smooth the signal provided to the comparator 202 input. Although n-type MOSFETs are depicted and described with respect to FIG. 3, other types of transistors also may be used.

The value of resistor 316 multiplied by the current Vbg/$R_{REF}$ determines the aforementioned voltage offset value (in other words, the amount by which V_PIN must be above V_SUP) to trip the comparator 202 from a low output to a high output. For example, the values of the resistor 316 and $R_{REF}$ are selected such that the voltage offset value is 0.2V, and thus V_PIN must be at least 3.5V relative to a V_SUP of 3.3V to trip the comparator 202. The resistor 314 is of the same type as the resistor 316 and serves to compensate for channel length modulation between the n-type MOSFETs 310, 312 by creating the same drain-to-source voltage ($V_{DS}$) at the trip point of the comparator 202.

In a first example, V_PIN is sufficiently low and thus the comparator 202 is not tripped, meaning that the output of the comparator 202 is low. For this example, it is assumed that V_SUP=3.3V, the voltage offset value (the voltage across resistors 314, 316 by virtue of the current source 308 and current mirror formed by n-type MOSFETs 302, 304, 306) is 0.2V, and V_PIN=3.4V (less than V_SUP plus the voltage offset value). Referring first to the n-type MOSFET 310, its gate voltage is 3.3V, while its drain voltage is 3.1V owing to the offset/voltage drop across the resistor 314, and its source voltage is a gate-to-source voltage (Vgs) below V_SUP, which is applied to the inverting terminal of the comparator 202. Referring now to the n-type MOSFET 312, its gate voltage is 3.4V, while its drain voltage is 3.3V, and its source voltage is also Vgs below V_PIN. The n-type MOSFETs 310, 312 are substantially similar such that their threshold voltages track each other across process, voltage, and temperature (PVT) variations, meaning that the threshold voltages of the n-type MOSFETs 310, 312 do not influence the comparison performed by the comparator 202. The voltage applied to the non-inverting terminal of the comparator 202 is lower than that applied to the inverting terminal of the comparator 202 by at least the offset/voltage drop across the resistor 316 (0.2V in this example), and thus the comparator 202 does not trip in this example since V_PIN is only 0.1V higher than V_SUP.

In a second example, V_PIN is sufficiently high (greater than V_SUP plus a voltage offset) and thus the comparator 202 is tripped. For this example, it is assumed that V_SUP=3.3V, the voltage offset value (the voltage across resistors 314, 316 by virtue of the current source 308 and current mirror 302, 304, 306) is 0.2V, and V_PIN=3.6V. Referring first to the n-type MOSFET 310, its gate voltage is 3.3V, while its drain voltage is 3.1V owing to the offset/voltage drop across the resistor 314, and its source voltage is Vgs below V_SUP, which is applied to the inverting terminal of the comparator 202. Referring now to the n-type MOSFET 312, its gate voltage is 3.6V, while its drain voltage is 3.3V, and its source voltage is also Vgs below V_PIN. As above, the Vgs is the same for both n-type MOSFET 310, 312 across pressure, voltage, and temperature variations, and thus the voltage at the inverting terminal of the comparator 202 is V_SUP−Vgs, while the voltage at the non-inverting terminal of the comparator 202 is V_PIN−Vgs—the offset voltage drop across resistor 316.

Figure 4A:
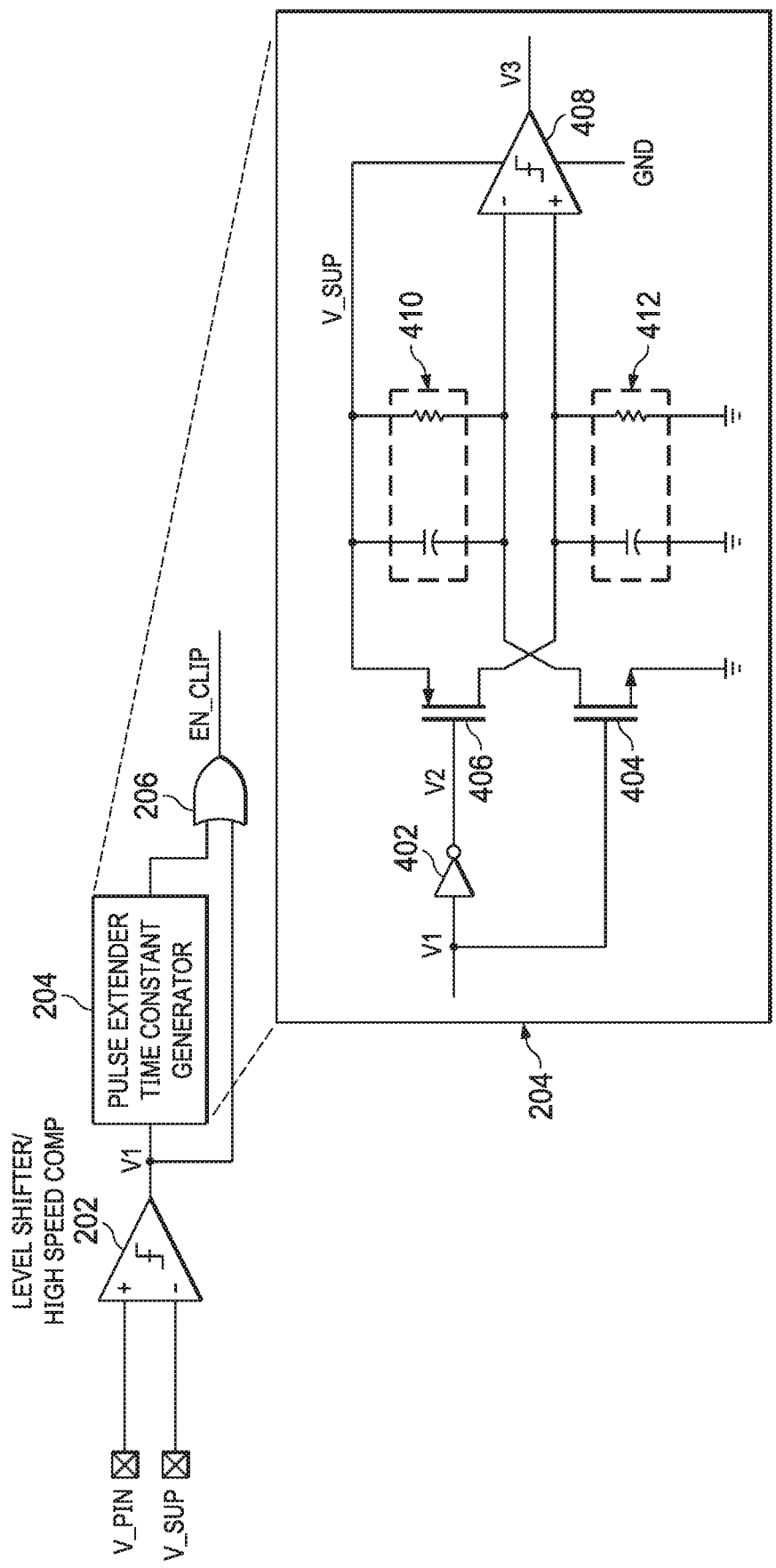
FIG. 4a shows a circuit diagram of a pulse extender of the overvoltage detection circuit in further detail and in accordance with various examples.

FIG. 4a shows an example of the pulse extender 204 of FIG. 2 in further detail. The output of the comparator 202 of FIGS. 2 and 3 is provided to the pulse extender 204 as an input. As explained above, there may be many overvoltage transients in a given window of time in which the transmitter 102 transmits and the receiver 108 receives a serial interface signal. To address this, the pulse extender 204 generates an output that remains high even though the comparator 202 output goes low, as would be the situation after an overvoltage pulse inside a receiving window of the receiver 108.

The pulse extender 204 includes a switch 404, such as an n-type MOSFET as depicted in FIG. 4a, coupled to the comparator 202 output and another switch 406, such as a p-type MOSFET as depicted in FIG. 4a, coupled to the comparator 202 output by way of an inverter 402. Thus, when the comparator 202 output is low, both the n-type MOSFET 404 and the p-type MOSFET 406 are off. On the other hand, when the comparator 202 output is high (the comparator 202 has been tripped by an overvoltage transient on the input pin 112), both the n-type MOSFET 404 and the p-type MOSFET 406 are on. The pulse extender 204 also includes a comparator 408 having an inverting terminal coupled to a drain of the p-type MOSFET 406 and a non-inverting terminal coupled to a drain of the n-type MOSFET 404. A resistor-capacitor (RC) circuit 410 is coupled between the supply voltage V_SUP and the inverting terminal of the comparator 408, while another RC circuit 412 is coupled between the non-inverting terminal of the comparator 408 and ground.

When the n-type MOSFET 404 and the p-type MOSFET 406 are on (when the comparator 202 has been tripped), the non-inverting terminal of the comparator 408 is tied to V_SUP and the inverting terminal of the comparator 408 is tied to ground, and thus the output of the comparator 408 is high. At the same time, V_SUP is applied across the RC circuits 410, 412 and their capacitors are charged. Subsequently, when the comparator 202 ceases to be tripped, for example after a serial interface signal pulse again goes low and thus an overvoltage transient is not present, the n-type MOSFET 404 and the p-type MOSFET 406 turn off. However, the RC circuits 410, 412 are designed with an RC time constant sufficient to maintain the relationship of the terminals of the comparator 408 for at least an expected time for another serial interface signal pulse to arrive. In some implementations, the RC time constant may be selected such that the output of the comparator 408 remains high for the duration of an expected receive window of the receiver 108. Once the receive window has passed, and thus no more overvoltage transients are received at the input pin 112, the non-inverting terminal eventually discharges to ground while the inverting terminal eventually charges to V_SUP. The output of the comparator 408 (via OR gate 206) corresponds to the enable signal explained with regard to FIG. 1, and thus the enable signal is asserted upon detecting an overvoltage transient, as well as for some time thereafter.

Figure 4B:
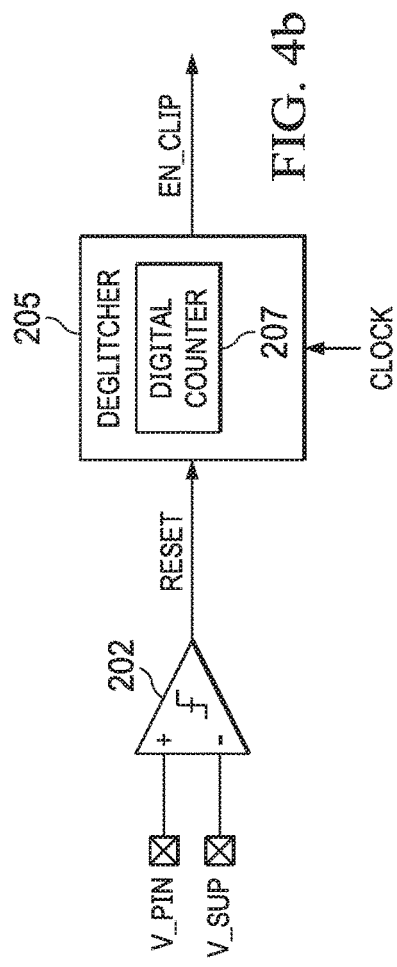
FIG. 4b shows another implementation of a pulse extender of the overvoltage detection circuit in accordance with various examples.

FIG. 4b shows another example in which the analog pulse extender 204 of FIG. 4a is replaced with a deglitcher 205 that includes a digital counter 207, for example a digital down counter. The output of the comparator 202 is an input to the deglitcher 205, which extends the assertion of an enable signal as a result of an overvoltage pulse inside a receiving window of the receiver 108. For example, when the comparator 202 output goes high, indicating an overvoltage transient, the digital counter 207 resets and the deglitcher 205 generates a high signal as the enable signal (which corresponds to assertion in this implementation). When the comparator 202 output goes low, the digital counter 207 begins a counting sequence and the output of the deglitcher 205 remains high until the digital counter 207 counting sequence (in this implementation, a countdown) is complete. Once the counting sequence is complete, the output of the deglitcher 205 (the enable signal) goes low (which corresponds to de-assertion in this implementation).

Figure 5:
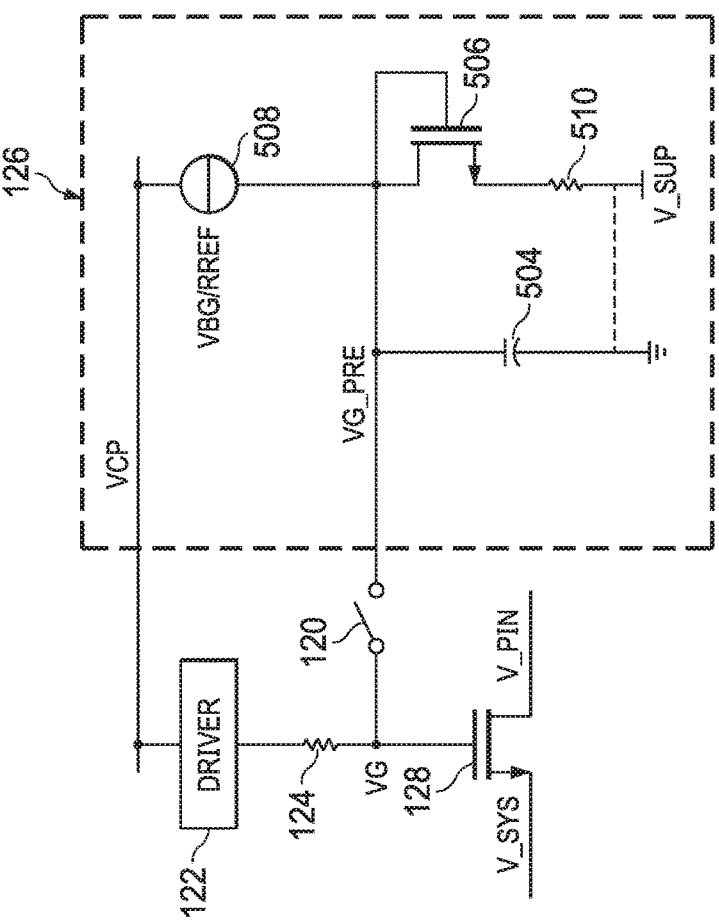
FIG. 5 shows a circuit diagram of an alternating current clipper circuit in accordance with various examples.

FIG. 5 shows the AC clipper circuit 126 in further detail. The AC clipper circuit 126 includes an n-type MOSFET 506 having a source coupled to the supply voltage source by way of a resistor 510. The n-type MOSFET 506 includes a gate-to-drain coupling and thus operates in saturation mode, and its drain is in turn coupled to a current source 508 that generates a current through the n-type MOSFET 506 and across the resistor 510 to set a desired voltage VG_PRE, which is the clamping voltage. The current source 508 is generated, for example, by applying a bandgap reference voltage (Vbg) across a resistor of a particular value ($R_{REF}$) and selecting the resistor 510 to achieve the desired VG_PRE. A capacitor 504 is coupled between the drain of the n-type MOSFET 506 and either ground or the supply voltage source (as illustrated by the optional coupling of the capacitor 504 to the node at V_SUP), and thus also becomes charged to VG_PRE when the switch 120 is open.

When an overvoltage transient occurs, causing the overvoltage detector 118 to assert an enable signal and close the switch 120, the clamping voltage VG_PRE is applied to the gate of the n-type MOSFET 128. As explained above, the n-type MOSFET 128 acts as a source-follower. Thus, VG_PRE is set such that the n-type MOSFET 128 clamps or regulates the voltage at pin 114 (FIG. 1b) to a tolerable level. The capacitor 504 allows VG to quickly settle to VG_PRE when coupled, and mitigates effects caused by gate-to-drain capacitance of the n-type MOSFET 128.

FIG. 6a shows an example set of waveforms 600 that includes a V_PIN voltage waveform, a V_SYS voltage waveform, and an enable (EN_CLIP) signal waveform. The V_PIN waveform demonstrates a serial interface signal received at the input pin 112 having a voltage of approximately 4.8V, which is in excess of the approximately 3.3V typically expected in the example of a USB interface. As a result, the overvoltage detector 118 detects the overvoltage transient condition (e.g., upon receiving the first pulse having a voltage of approximately 4.8V) and asserts an enable signal as shown in the enable signal waveform. Although the first pulse is short in duration, the enable signal remains asserted or high due to the pulse extender 204 as explained above. Although the enable signal is asserted quickly, coupling the AC clipper circuit 126 to the gate of the n-type MOSFET 128, the output signal voltage V_SYS is initially higher due to the time required for a gate capacitance of the n-type MOSFET 128 to discharge. In the example of FIG. 6a, this settling time may be on the order of 600 ns, at which point V_SYS is clamped to approximately 3.5V, or slightly less than a VG_PRE of 3.7V in the example shown.

Figure 6B:
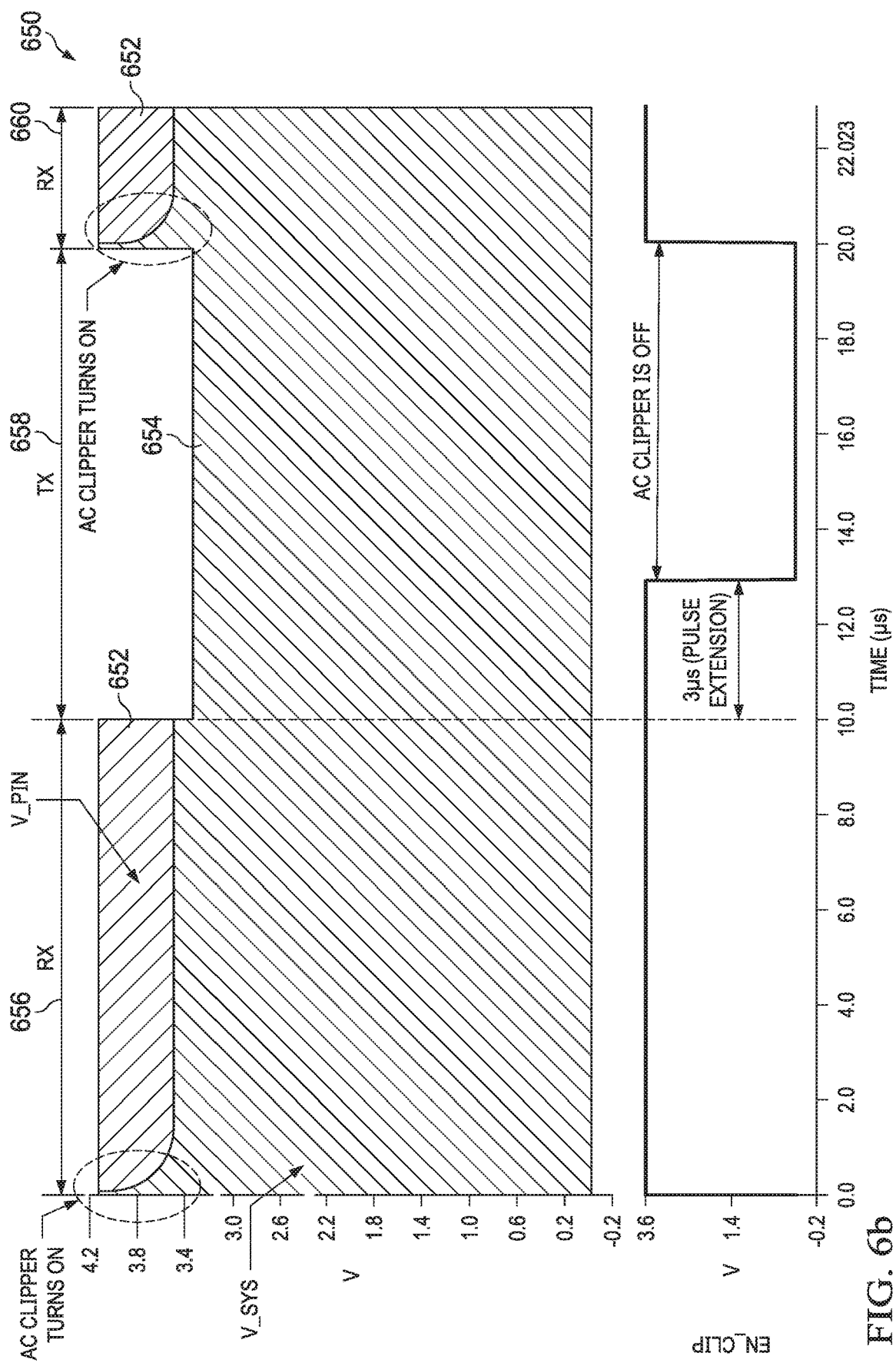

FIG. 6b shows a similar example set of waveforms 650, with a V_PIN voltage waveform 652 and a V_SYS voltage waveform 654 superimposed, and a corresponding enable single (EN_CLIP) waveform below. The waveforms 652, 654 span a first receive window 656, a transmit window 658, and the beginning of a subsequent receive window 660 for the receiver 108. They demonstrate the pulse extension of the enable signal in addition to the clamping behavior of the AC clipper circuit 126. Similar to FIG. 6a, the V_PIN waveform 652 demonstrates a serial interface signal received at the input pin 112 having a voltage of approximately 4.1V, which is in excess of the approximately 3.3V typically expected in the example of a USB interface. The enable signal is quickly asserted, and remains high, while V_SYS waveform 654 is clamped to approximately 3.5V after an initial settling period due to the discharging of gate capacitance of the n-type MOSFET 128. Once the receive window 656 is complete, the enable signal remains high or asserted for a period of time (e.g., 3 microseconds as indicated in FIG. 6b) due to the time constants of the RC circuits 410, 412, at which point the enable signal goes low or is de-asserted. The process repeats itself during the subsequent receive window 660.

As a result, despite overvoltage transients that result from impedance mismatches between the transmitter 102 and the serial interface cable 110, the output signal provided to the receiver circuitry at the output pin 114 is clamped to a level that will avoid damage to the low-voltage components of the receiver 108 and reducing the likelihood of device failures in the field.

Figure 7:
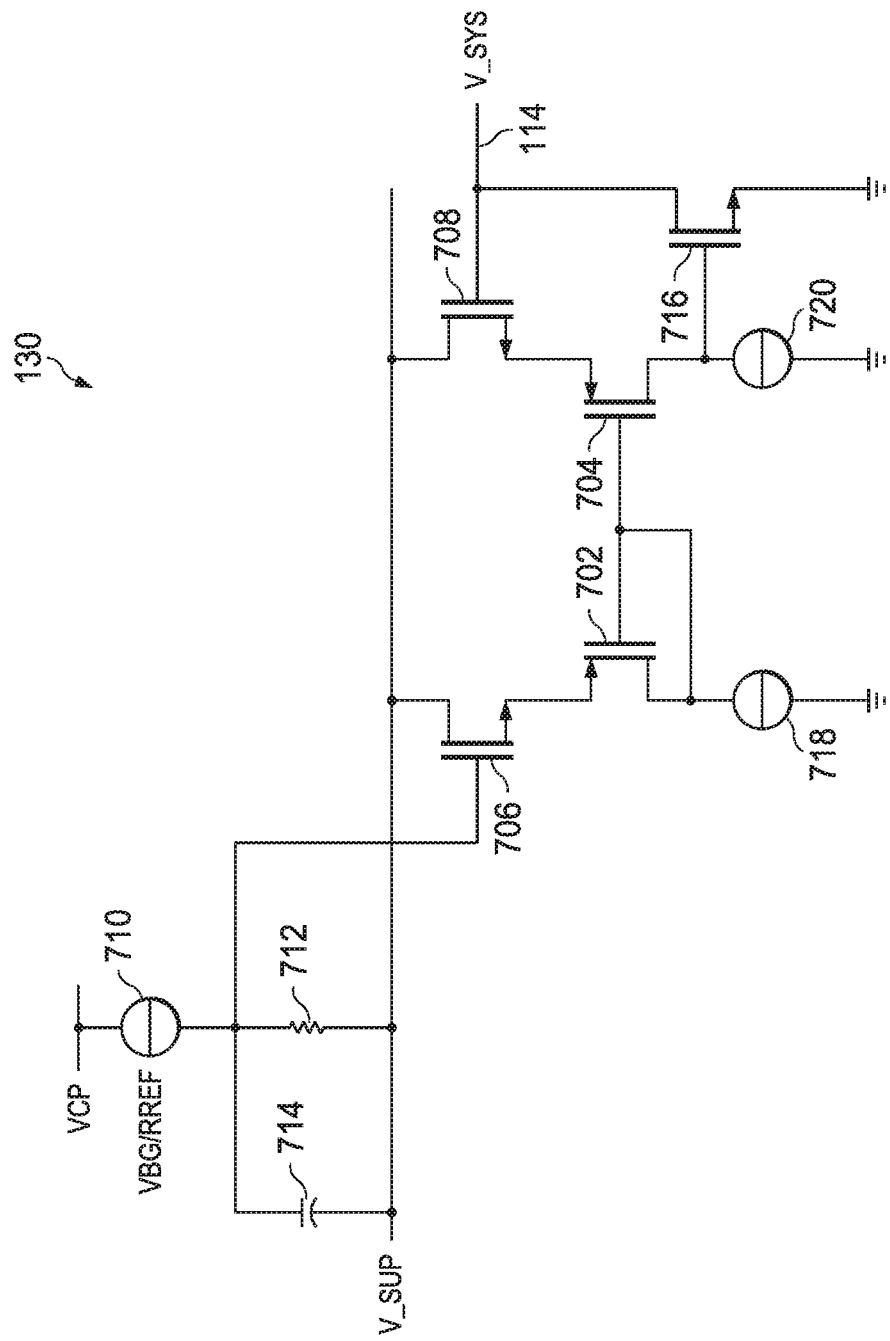
FIG. 7 shows a circuit diagram of a direct current clipper circuit in accordance with various examples.

FIG. 7 shows the DC clipper circuit 130 in further detail. As explained above, the DC clipper circuit 130 regulates V_SYS in the situation of a DC overvoltage condition, adding further protection to the low-voltage circuitry of the receiver 108. The DC clipper circuit 130 includes a common-gate amplifier that comprises n-type MOSFETs 702, 704 and bias current sources 718, 720 coupled to the drains of the n-type MOSFETs 702, 704. The DC clipper circuit includes a current source 710, similar to those described above, which in conjunction with a resistor 712 sets a gate voltage of an n-type MOSFET 706 to a level above V_SUP, which is coupled to the drain of n-type MOSFET 706. In some examples, a voltage drop exists across the current source 710 from the charge pump voltage VCP to V_SUP plus the voltage across the resistor 712. A capacitor 714 is coupled to the current source 710 and to the drain of the n-type MOSFET 706, and serves as an AC coupling to reduce the impact of voltage variations on the gate of the n-type MOSFET 706. A source of the n-type MOSFET 706 is coupled to the p-type MOSFET 702. The DC clipper circuit 130 also includes an n-type MOSFET 708 having a drain coupled to V_SUP, a gate coupled to V_SYS, and a source coupled to the p-type MOSFET 704. An n-type MOSFET 716 has a drain coupled to V_SYS, a gate coupled to the p-type MOSFET 704, and a source coupled to ground.

As mentioned, one purpose of the DC clipper circuit 130 is to regulate (e.g., stabilize) V_SYS. The DC clipper circuit 130 regulates V_SYS using the common-gate amplifier (which, as explained above, includes the p-type MOSFETs 702, 704 and the bias current sources 718, 720). The common-gate amplifier uses a feedback loop in the DC clipper circuit 130 to regulate V_SYS. Specifically, the common-gate amplifier continually adjusts the gate voltage provided to the n-type MOSFET 716 to achieve the same voltages at the source terminals of the p-type MOSFETs 702, 704. In response to unequal voltages at the source terminals of the p-type MOSFETs 702, 704, the common-gate amplifier adjusts the gate voltage applied to the n-type MOSFET 716, which, in turn, increases or decreases drain-to-source channel width in the n-type MOSFET 716. This regulates V_SYS at output pin 114. Because the source voltages of the p-type MOSFET 704 depends on V_SYS (as explained below), regulating V_SYS affects the source voltage of the p-type MOSFET 704 and causes the source voltages of the p-type MOSFETs 702, 704 to equalize.

The voltage at the source terminal of the p-type MOSFET 702 is defined with reference to V_SUP. Specifically, the voltage drop between the source and gate terminals of the p-type MOSFET 702 is Vgs, and the drop across resistor 712 is the current from the current source 710 multiplied by the resistance of resistor 712. Thus, the source terminal voltage for the p-type MOSFET 702 is V_SUP+offset voltage across resistor 712−Vgs. The voltage at the source terminal of the p-type MOSFET 704, however, is defined with reference to V_SYS; specifically, it is V_SYS−Vgs. Because the common-gate amplifier continually seeks to equalize the voltages at these two source terminals, V_SUP+offset voltage across resistor 712−Vgs=V_SYS−Vgs. Because the source terminals are of equal voltage and the gate terminals are tied together, the Vgs values are the same and thus are negligible. Accordingly, V_SYS=V_SUP+offset voltage across resistor 712. Therefore, V_SYS is regulated to V_SUP+offset voltage across resistor 712.

In the foregoing discussion and in the claims, reference is made to a system for suppressing overvoltage transients, including multiple different sub-circuits and circuit elements. It should be appreciated that the system, the sub-circuits, and the circuit elements, as the case may be, correspond to hardware circuitry, for example implemented on an integrated circuit (IC). Indeed, in at least one example, the system for suppressing overvoltage transients is implemented on an IC.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An apparatus, comprising:
an interface input and a system output, the interface input being adapted to receive serial interface signals having an input voltage;
a first transistor coupled between the interface input and the system output, the transistor having a transistor control input;
a gate driver having a driver output coupled to the transistor control input;
a gate resistor having a first terminal coupled to the driver output, and having a second terminal coupled to the transistor control input;
a clipper circuit that includes a current source, a second transistor, and a resistor coupled in series between a charge pump terminal and a supply voltage terminal, and having a clipper output coupled to between the current source and the second transistor;
a switch having one terminal coupled to the clipper output, having another terminal coupled to the second terminal of gate resistor and the transistor control input, and having a switch control input; and an overvoltage detection circuit having an input coupled to the interface input and an enable output coupled to the switch control input.

2. The apparatus of claim 1, including: a second circuit coupled to the system output and configured to regulate an output voltage at the system output in response to the output voltage exceeding an output voltage threshold.

3. The apparatus of claim 1, in which the overvoltage detection circuit is configured to provide an enable signal on the enable output for a time period greater than a time period during which the input voltage of the interface input exceeds an input voltage threshold.

4. The apparatus of claim 3, in which the overvoltage detection circuit includes a digital counter configured to start a counting sequence after generating the enable signal, the overvoltage detection circuit is configured to cease generation of the enable signal when the digital counter completes the counting sequence.

5. The apparatus of claim 3, in which the input voltage threshold includes the supply voltage.

6. The apparatus of claim 3, in which the input voltage threshold includes the supply voltage plus a voltage offset.

7. The apparatus of claim 1, in which the interface input is a Universal Serial Bus (USB) interface and forming a USB port.

8. An apparatus, comprising:
an interface input and a system output, the interface input being adapted to receive serial interface signals;
a first transistor having a first terminal coupled to the interface input, a second terminal coupled to the system output, and a transistor control input;
a gate driver having a driver output coupled to the transistor control input;
an overvoltage detection circuit having an input coupled to the interface input, the overvoltage detection circuit including:
a first comparator having a first comparator output, having a non-inverting input terminal coupled to the interface input, and an inverting input terminal coupled to a supply voltage source;
pulse extender circuitry having an input coupled to the first comparator output and having a pulse extender output; and
an OR gate having inputs coupled to the first comparator output and to the pulse extender output, and having a gated output;
a clipper circuit including a current source and a second transistor coupled in series between a first voltage source and a second voltage source, the clipper circuit having a clipper output; and
a switch having a first terminal coupled to the clipper output, having a second terminal coupled to the transistor control input, and having a switch control input coupled to the gated output.

9. The apparatus of claim 8, in which a threshold voltage of the first transistor is approximately equal to a threshold voltage of the second transistor.

10. The apparatus of claim 8, in which the overvoltage detection circuit includes a voltage offset circuit, the voltage offset circuit including:
a first current mirror having first, second, and third n-type field effect transistors (FETs), each n-type FET having a source coupled to ground, and in which a drain and a gate of the third n-type FET are coupled together;

a fourth n-type FET having a drain coupled to the supply voltage source via a first resistor, a gate coupled to the supply voltage source, and a source coupled to the inverting terminal of the first comparator and to a drain of the second n-type FET; and
a fifth n-type FET having a drain coupled to the supply voltage source, a gate coupled to the interface input, and a source coupled via a second resistor to the non-inverting terminal of the first comparator and to the drain of the third n-type FET.

11. The apparatus of claim 8 in which the pulse extender includes:
a second comparator having an inverting input, a non-inverting input, and the pulse extender output;
an n-type field effect transistor (FET) having a gate coupled to the first comparator output, a source coupled to the ground, and a drain coupled to the inverting terminal of the second comparator;
a first p-type FET having a gate coupled to the first comparator output through an inverter, a source coupled to the supply voltage source, and a drain coupled to the non-inverting terminal of the second comparator;
a first resistor-capacitor (RC) circuit coupled to the supply voltage source and to the inverting terminal of the second comparator; and
a second RC circuit coupled to ground and to the non-inverting terminal of the second comparator.

12. The apparatus of claim 8 including a second circuit, including:
a common-gate amplifier having first and second p-type field effect transistors (FETs);
a third n-type FET having a gate coupled to the supply voltage source via a fourth resistor, a drain coupled to the supply voltage source, and a source coupled to the common-gate amplifier;
a fourth n-type FET having a gate coupled to the output pin, a drain coupled to the supply voltage source, and a source coupled to the common-gate amplifier; and
a fifth n-type FET having a gate coupled to the common gate amplifier, a drain coupled to the output pin, and a source coupled to ground.

13. The apparatus of claim 8 in which the interface input forms a Universal Serial Bus (USB) port configured to receive a USB interface signal.

14. A system, comprising:
an interface input adapted to receive serial interface signals, and a system output;
a transistor coupled between the interface input and the system output, the transistor having a transistor control input;
a gate driver having a charge pump voltage input and having a driver output;
a first resistor coupled between the driver output and the transistor control input;
a first clipper circuit including a current source, a second transistor, and a resistor coupled between a charge pump voltage input and a supply voltage terminal, and having a first clipper output coupled to between the current source and the second transistor;
a switch having a first terminal coupled to the clipper output, having a second terminal coupled to the transistor control input through the first resistor, and having a switch control input; and an overvoltage detection circuit having a supply voltage input, having an input coupled to the interface input, and having a clip enable output coupled to the switch control input.

15. The system of claim 14 including a second clipper circuit having an output coupled to the system output.

16. The system of claim 14, in which the overvoltage detection circuit includes:
    pulse extender circuitry having a comparator input and a pulse output; and
    an OR gate having a first input coupled to the comparator input, having a second input coupled to the pulse output, and having the clip enable output.

17. The system of claim 16, in which the overvoltage detection circuit includes a digital counter configured to start a counting sequence after generating an enable signal on the enable output, the overvoltage detection circuit is configured to cease generation of the enable signal when the digital counter completes the counting sequence.

18. The system of claim 14, in which a threshold for the serial interface signals includes the supply voltage plus a voltage offset.

19. A Universal Serial Bus circuit comprising:
    a serial interface input and a serial interface output;
    a first transistor having a first terminal coupled to the serial interface input, having a second terminal coupled to the serial interface output, and having a control input, in which the first transistor is configured to control coupling of serial interface input signals to the serial interface output;
    a transistor driver circuit having a charge pump voltage input and having a driver output;
    a first resistor having a first terminal connected to the driver output, and having a second terminal connected to the control input;
    a clipper circuit having a first terminal coupled to the charge pump voltage input, having a supply voltage terminal, and having a clamping voltage output, the clipper circuit including circuitry providing a clamping voltage from the charge pump voltage input;
    an overvoltage protection circuit having an input coupled to the serial interface input and having an enable clip output, the overvoltage protection circuit including:
        detector circuitry to detect an overvoltage on the serial interface input and produce an enable clip signal on the enable clip output; and
        timing circuitry to extend the enable clip signal beyond a time of a detected overvoltage; and
    a first switch having a first switch terminal connected to the resistor second terminal and connected to the control input, having a second terminal connected to the clamping voltage output, and having a control input connected to the enable clip output, the first switch closing in response to the enable clip signal, connecting the clamping voltage to the first transistor control input during and after an overvoltage on the serial interface input to protect the serial interface output from an overvoltage.

20. The Universal Serial Bus circuit of claim 19 in which the serial interface input is a Universal Serial Bus port.

21. The Universal Serial Bus circuit of claim 19 in which the timing circuitry includes one of a time constant generator and a counter.

22. The Universal Serial Bus circuit of claim 19 in which the clipper circuit includes a capacitor having one terminal connected to the clamping voltage output.

23. The Universal Serial Bus circuit of claim 19 in which the clamping voltage is set such that the first transistor clamps or regulates the voltage received at the serial interface input.

24. The Universal Serial Bus circuit of claim 19 in which the clipper circuit includes a second transistor coupled between the charge pump voltage input and the supply voltage terminal through a current source.

* * * * *